(12) United States Patent
Lee

(10) Patent No.: US 8,610,359 B2
(45) Date of Patent: Dec. 17, 2013

(54) DISPLAY DEVICE

(75) Inventor: Jeong Ik Lee, Gunpo-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 161 days.

(21) Appl. No.: 13/359,438

(22) Filed: Jan. 26, 2012

(65) Prior Publication Data

US 2013/0181615 A1   Jul. 18, 2013

(30) Foreign Application Priority Data

Jan. 18, 2012   (KR) .................. 10-2012-0005618

(51) Int. Cl.
*G09G 3/10* (2006.01)

(52) U.S. Cl.
USPC .............. 315/169.3; 315/167; 315/169.1

(58) Field of Classification Search
None
See application file for complete search history.

(56) References Cited

U.S. PATENT DOCUMENTS 7,825,592 B2 * 11/2010 Nakamura ............. 313/506

FOREIGN PATENT DOCUMENTS

KR   2007-0008071 A   1/2007

* cited by examiner

*Primary Examiner* — Anh Tran
(74) *Attorney, Agent, or Firm* — Rabin & Berdo, P.C.

(57) ABSTRACT

Disclosed is a display device, the device including a light emitting part including a first electrode, an organic light emitting layer and a second electrode for radiating light of a first wavelength, a pixel part stacked on the light emitting part to radiate light of a second wavelength using a reflective light, and a capping layer arranged between the light emitting part and the pixel part to reflect the light of the first wavelength and to transmit the light of the second wavelength, whereby legibility, color reproduction range and power consumption can be enhanced.

14 Claims, 2 Drawing Sheets

$$\lambda_1 \times T \qquad \lambda_2 \times \frac{b}{(b+t)}$$

DISPLAY DEVICE

Pursuant to 35 U.S.C. §119 (a), this application claims the benefit of earlier filing date and right of priority to Korean Patent Application No. 10-2012-0005618, filed on Jan. 18, 2012, the contents of which is hereby incorporated by reference in their entirety.

BACKGROUND OF THE DISCLOSURE

1. Field

The teachings in accordance with the exemplary embodiments of this present disclosure generally relate to a display device, and more particularly to a display device configured to improve legibility, color reproduction range and power consumption.

2. Background

Organic electroluminescent devices, for example, organic electroluminescent diodes, are provided with a thin film containing a light-emitting organic compound between an anode and a cathode. By injecting holes and electrons from the respective electrodes, excitons of the light-emitting organic compound are generated. When these excitons return to a ground state, the organic electroluminescent devices irradiate light.

Recent developments in organic electroluminescent devices have been very significant. Characteristic examples of such developments include high brightness at low applied voltages, more diversity in emission wavelengths, wider viewing angle, rapid response, greater color reproduction range, and the ability to produce thinner and lighter light-emitting devices. As a result of these developments, a broad range of possible applications to illumination fields using the organic electroluminescent devices has been briskly waged.

FIG. 1 is a schematic view illustrating a stacked structure of an organic electroluminescent device according to prior art, where the device is stacked with a substrate (11), an anode (12) which is a transparent electrode, an organic light emitting layer (13), a cathode (14) which is a reflective electrode and a protective film (15) in that order.

A full color spectrum in the organic electroluminescent device is realized by having pixels that separately emit red (R), green (G), and blue (B) colors, or by white color. At this time, in order to express a desired color, a plurality of organic electroluminescent devices configured to emit light of different wavelengths is coupled for use.

Korea Laid-open Patent Application No. 2007-0008071 discloses a technique in which each width of organic light emitting structures is vertically stacked at a predetermined level to equalize an area of RGB sub-pixel and an area of pixel, whereby luminance can be increased and pixelization can be eased. However, according to this structure, light generated from a sub-pixel positioned at a middle section is reflected from a sub-pixel positioned at a distal end to be emitted to the outside and to disadvantageously reduce the light efficiency. Another disadvantage is that light radiated from the organic light emitting structures is reduced in legibility under a bright environment such as the sun light.

Meanwhile, although power consumption can be greatly reduced by radiating light using a reflective light in case of a reflective pixel used for electronic paper, disadvantage is that the color reproduction range is low, and it is difficult to use at night.

SUMMARY OF THE INVENTION

The present disclosure has been made to solve the foregoing disadvantages of the prior art, and therefore an object of certain embodiments of the present disclosure is to provide a display device configured to improve legibility, color reproduction range and power consumption.

Technical subjects to be solved by the present disclosure are not restricted to the above-mentioned description, and any other technical problems not mentioned so far will be clearly appreciated from the following description by the skilled in the art. That is, the present disclosure will be understood more easily and other objects, characteristics, details and advantages thereof will become more apparent in the course of the following explanatory description, which is given, without intending to imply any limitation of the disclosure, with reference to the attached drawings.

An object of the invention is to solve at least one or more of the above problems and/or disadvantages in whole or in part and to provide at least advantages described hereinafter. In order to achieve at least the above objects, in whole or in part, and in accordance with the purposes of the disclosure, as embodied and broadly described, and in one general aspect of the present disclosure, there is provided a display device, the device comprising: a light emitting part including a first electrode, an organic light emitting layer and a second electrode for radiating light of a first wavelength; a pixel part stacked on the light emitting part to radiate light of a second wavelength using a reflective light; and a capping layer arranged between the light emitting part and the pixel part to reflect the light of the first wavelength and to transmit the light of the second wavelength.

Preferably, but not necessarily, the capping layer is stacked on the second electrode.

Preferably, but not necessarily, the capping layer reflects 40% or more of light of the first wavelength, and transmits 60% or more of light of second wavelength.

Preferably, but not necessarily, the display device further comprises a color filter part interposed between the light emittingpart and the pixel part to enhance a color reproduction range of the light of the second wavelength.

Preferably, but not necessarily, the display device further comprises a color filter part arranged at the light emitting part to enhance a color reproduction range of the light of the second wavelength.

Preferably, but not necessarily, a pixel size of the pixel part is smaller than that of the light emitting part.

Preferably, but not necessarily, the reflective light is light radiated from the light emitting part.

Preferably, but not necessarily, the display device further comprises a capping layer arranged at the light emitting part to reflect the light of the first wavelength and to transmit the light of the second wavelength.

In another general aspect of the present disclosure, there is provided a display device, the device comprising: an optical sensor measuring intensity of external light; and a controller driving the light emitting part and the pixel part in response to the intensity of light measured by the optical sensor.

Preferably, but not necessarily, the controller drives the light emitting part in a case the intensity of the external light is less than a reference value.

Preferably, but not necessarily, the controller drives the light emitting part in a case the measured intensity of light is less than a first reference value, drives the pixel part in a case the measured intensity of light is more than a second reference value, and drives the light emitting part and the pixel part in a case the measured intensity of light is in between the first reference value and the second reference value.

Preferably, but not necessarily, the controller controls in such a manner that, the driving power of the light emitting part when the measured intensity of light is in between the first reference value and the second reference value is smaller than that of the light emitting part when the measured intensity of light is less than the first reference value.

Preferably, but not necessarily, the controller adjusts the intensity of light of the first wavelength in response to the measured intensity of light to enhance color reproduction range of the pixel part.

The display device according to the present disclosure has an advantageous effect in that it includes a self-emissive light emitting part and a reflectively-emissive pixel part together to improve legibility, color reproduction range and power consumption.

For example, the pixel part is operated during a day environment when sun light is available to thereby improve legibility and power consumption. The light emitting part is operated at night when the sun light is not available to improve legibility. At the same time, the light emitting part is auxiliarily operated when the pixel part is operated, to improve the color reproduction range that has been problematic at the pixel part.

Another advantageous effect is that a capping layer is added that transmits light of the pixel part and reflects light of the light emitting part, to improve light extraction efficiency, whereby the power consumption can be reduced.

Still another advantageous effect is that a color filter is added to improve the color reproduction range of the pixel part.

BRIEF DESCRIPTION OF THE DRAWINGS

The accompanying drawings, which are included to provide a further understanding of the disclosure and are incorporated in and constitute apart of this application, illustrate embodiment(s) of the disclosure, and together with the description serve to explain the principle of the disclosure. In the drawings.

DETAILED DESCRIPTION

Various exemplary embodiments will be described more fully hereinafter with reference to the accompanying drawings, in which some exemplary embodiments are shown. The present inventive concept may, however, be embodied in many different forms and should not be construed as limited to the example embodiments set forth herein. Rather, these exemplary embodiments are provided so that this description will be thorough and complete, and will fully convey the scope of the present inventive concept to those skilled in the art.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated.

Descriptions of well-known components and processing techniques are omitted so as not to unnecessarily obscure the embodiments of the disclosure.

As used herein, the OLED display and OLED display device may be interchangeably used.

Hereinafter, a display device according to the present disclosure will be described in detail with reference to the accompanying drawings.

Figure 1:
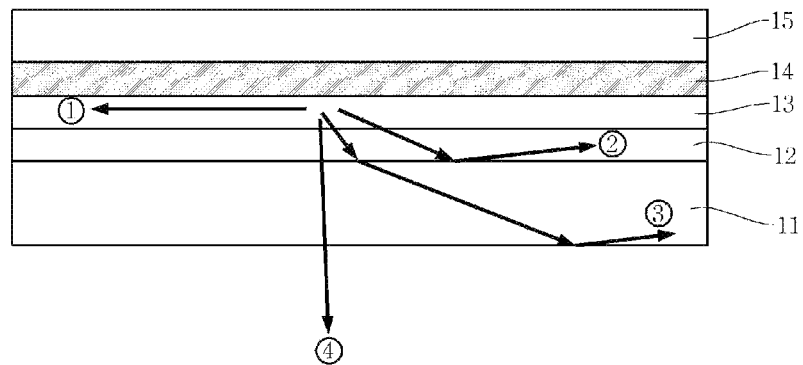
FIG. 1 is a schematic view illustrating a stacked structure of an organic electroluminescent device according to prior art.
Figure 2:
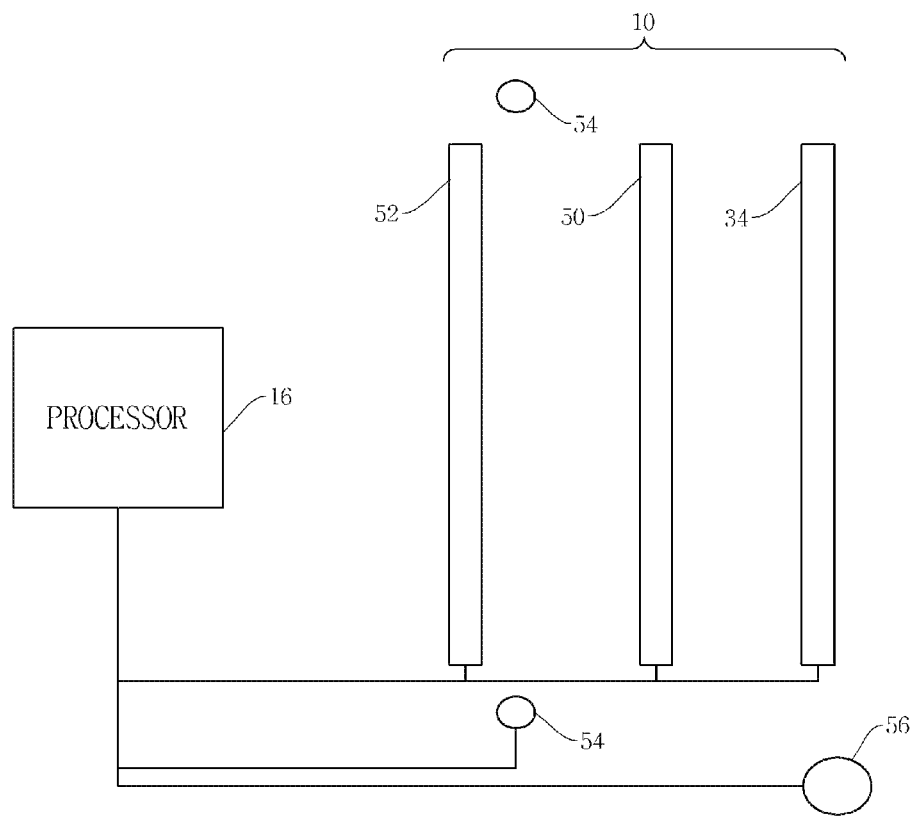
FIG. 2 is a schematic view illustrating an OLED (Organic Light Emitting Diode) display device according to the present disclosure.

FIG. 2 is a schematic view illustrating an OLED (Organic Light Emitting Diode) display device according to the present disclosure.

The OLED display device (10) communicates with a processor (16) such as a CPU (Central Processing Unit) or a GPU (Graphic Processing Unit). The OLED display device (10) is formed in a multiple layer structure including an OLED panel (34), a switchable layer 50, e.g., shutter layer) and a background layer (52).

The OLED panel (34) is formed with a light radiation structure configured to allow a pixel specified within the OLED panel to emit light of various colors. That is, the pixel in the OLED display device actually radiates light responsive to an electrical control signal, in contrast to separation of light and modulation of the light as transmitted through the pixel.

The background layer (52) reflects white color or ambient color to a user side, that is, to a front surface, like a sheet printed to white color or other colors. The switchable layer (50) is interposed between the background layer (52) and the OLED panel (34). The switchable layer (50) is modulated to an opaque state or a transparent state. The switchable layer (50) is opaque when the electric field is not generated to make the background layer (52) invisible through the transparent OLED panel (34).

The opaqueness of the switchable layer (50) provides black or other solid color to the OLED panel (34) as a background. The switchable layer (50) is transparent when the electric field is formed to make the background layer (52) visible through the transparent OLED panel (34).

A variety of technologies maybe utilized to formation of a switchable layer. The switchable layer includes a layer of an active material positioned between two electrodes. For example, the switchable layer is formed with a PSE hybrid layer. Phosphorescent particles are evenly dispersed on the PSE hybrid layer when moved to a screen edge or an external distal end like bezel under an electric field-free state and an electric field available state.

Furthermore, the switchable layer may include a PDLC (Polymer Dispersed Liquid Crystal) device, SPDs (Suspended Particle Devices), a polymer solid electrolyte or micro blind. In addition, the OLED display device may include a backlight (54) emitting light for the background layer (52) in response to a control signal of the processor (16). The processor (16) controls opaqueness/transparency of the switchable layer (50) in response to user request or intensity of ambient light and controls quantity of light of the background layer (52).

An optical sensor (56) may be added to the OLED display device (10). The optical sensor (56) detects quantity of light around the OLED display device, and provides the ambient quantity of light to the processor. The processor controls the opaqueness/transparency level of the switchable layer (50) in response to the detected ambient quantity of light, and controls quantity of light at the background layer provided by the backlight.

Figure 3:
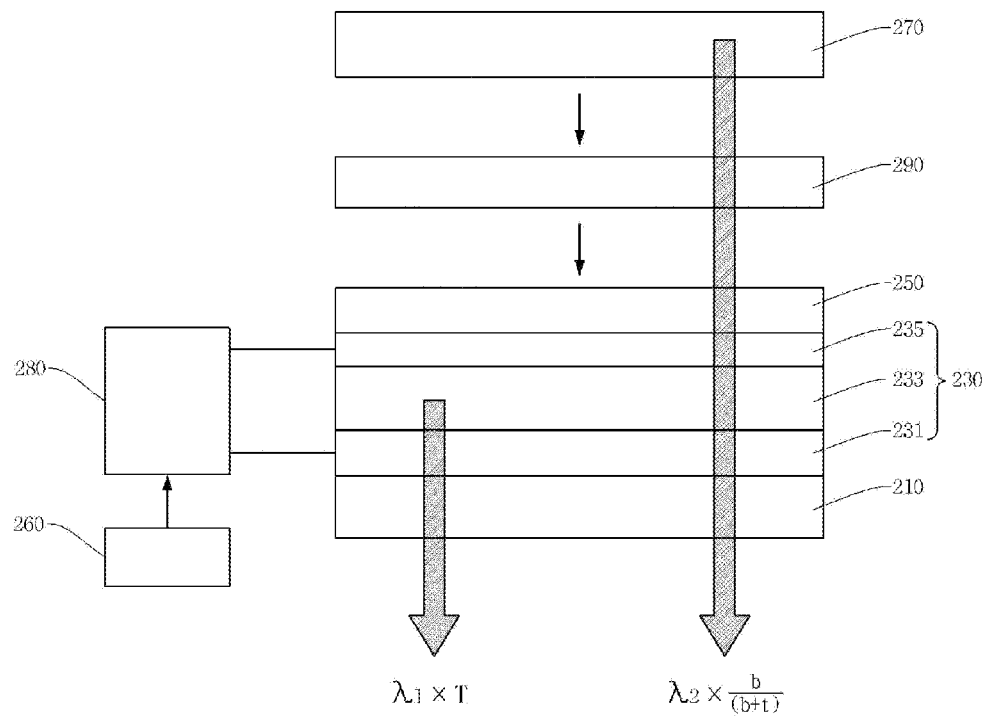
FIG. 3 is a schematic view illustrating a display device according to the present disclosure.

FIG. 3 is a schematic view illustrating a display device according to the present disclosure.

The display device illustrated in FIG. 3 includes a light emitting part (230) stacked on a first electrode (231), an organic light emitting layer and a second electrode (235) for radiating light of a first wavelength; and a pixel part (270) stacked on the light emitting part (230) to radiate light of a second wavelength using a reflective light.

The light emitting part (230) is transparent altogether because the first electrode (231) and the second electrode (235) are all transparent. The light emitting part may be the OLED display device (10) illustrated in FIG. 2. However, in a case the light emitting part is not operated while the pixel part is operated, the switchable layer forming the light emitting layer is made to be transparent even if the pixel part is operated, so that the light radiated from the pixel part is not interrupted by the light emitting part. In some exemplary embodiments, a configuration free from the switchable layer may be considered.

The light emitting part radiates the light of the first wavelength generated by a first organic light emitting layer (233) to all directions, and directly passes the light of the second wavelength introduced from outside. The light emitting part may be the aforementioned organic light emitting device, for example, an OLED (Organic Light Emitting Diode). The OLED may be configured to be foldable or bendable. The light emitting part is a self-emissive device, and may be useful in a bright environment but may create a problem of legibility in an environment such as the sun light.

The pixel part (270) is operated by an outside light to radiate/generate light. In a non-limiting example, the pixel part may be electronic paper, which is also called e-paper. Unlike a display using a backlight for illuminating pixels, the e-paper uses a reflective light as the conventional paper. Thus, the e-paper can display letters and pictures without consumption of power.

Furthermore, the e-paper can be folded and bent unlike the display. Pixels of e-paper may be maintained without any additional consumption of power. The e-paper has been developed to cope with restriction of a computer monitor. The e-paper has a wider viewing angle than a crystal display so that the e-paper can easily read out letters at a hardly invisible angle. The e-paper is very light, durable and a most bendable technological display achievement in existence, albeit being less bendable than paper.

On the other hand, the e-paper cannot be used as a backlight because of physical property of using reflective light. Furthermore, the color reproduction range is not great due to limitation caused by electronic ink method applied to e-paper. Still furthermore, the e-paper, being reflective type, can hardly be used at an environment where there is no light source like at night.

The pixel part (270) is stacked on the light emitting part (230) such that the display device according to the present disclosure includes both a self-emissive light source and a reflective light source. As a result, the self-emissive light emitting part (230) of the e-paper is not operated daytimes but only the reflective light source of pixel part is operated to save power consumption and concurrently improve the legibility. Furthermore, the light emitting part (230) is operated at night to allow the e-paper to perform the conventional display function. Thus, the e-paper has all the advantages of both the self-emissive light emitting display and the reflective display at the same time.

At this time, what is to be considered is that the light emitting part is operated as a driving light source of the pixel part during operation of the light emitting part. Ideally, the pixel part should not be operated during operation of the light emitting part. However, light generated by the light emitting part is radiated to a side of the substrate (210) where the light emitting part is arranged, and to a side of the pixel part at the same time. The light thus radiated to the side of the pixel part is operated for use as a driving light source of the pixel part. Thus, both the light emitting part and the pixel part are operated to allow pixels to be doubly emitted, disabling to reproduce a desired color or deteriorating legibility.

To solve the disadvantages, the display device may include a capping layer (250) that is interposed between the light emitting part (230) and the pixel part (270) to reflect light of the first wavelength and to transmit light of the second wavelength.

The capping layer (250) is stacked between the light emitting part (230) and the pixel part (270). In a case the light emitting part (230 is stacked with the first electrode (231), the organic light emitting layer (233) and the second electrode (235) in that order, the capping layer (250) may be arranged at any one position of the following positions. Furthermore, the capping layer (250) may be arranged at each interior of electrodes. That is, each electrode is arranged in a two-tier structure, and the capping layer maybe arranged in between the two-tier structure.

①-first electrode-first organic light emitting layer-second electrode-①

FIG. 3 exemplifies the light emitting part (230) arranged on the substrate (210), where the capping layer (250) is arranged at the second electrode (235). To be more specific, the capping layer (250) is arranged at a surface (external surface) opposite to the stacked surface with the organic light emitting layer among two surfaces of the second electrode (235).

The light emitting part illustrated in FIG. 3 is stacked on the substrate (210) with the first electrode (231), the organic light emitting layer (233), the second electrode (235) and the capping layer (250) in that order. At this time, an additional layer may be interposed between each layer performing a supplementary function.

The first electrode may be an anode of transparent property, and the second electrode may be a cathode of transparent property. Positions of anode and cathode may be oppositely changed based on manufacturing method of OLED. The substrate (210) may be a transparent substrate of glass or synthetic resin material. The cathode is formed with a metal film, and very thinly stacked to possess the transparent property.

The capping layer (250) reflects light of first wavelength generated by the light emitting part (230), to be more specific, the organic light emitting layer (233). Therefore, in a case the capping layer (250) is stacked between the light emitting layer (230) and the pixel part (270), the light generated from the light emitting part (230) is reflected from the capping layer (250) to be radiated to a direction where the pixel part is not stacked.

Furthermore, the capping layer (250) transmits the light of the second wavelength. The light of the second wavelength is light different from the light of the first wavelength. The light of the second wavelength is generated, not from the light emitting part (230), but introduced from outside. For information, the first and second wavelengths indicated in the present disclosure may define any one wavelength or a plurality of wavelengths.

As illustrated in FIG. 3, in a case the light of the second wavelength is introduced to a side of the second electrode, the light of the second wavelength is radiated to a side of the first electrode, where the radiation direction is same as that of the light of the first wavelength. At this time, the light of the second wavelength introduced to the side of the second electrode is light generated by the pixel part. The light of second wavelength introduced to the side of the first electrode like the sun light that drives the pixel part transmits the capping layer and reaches the pixel part.

Figure 4:
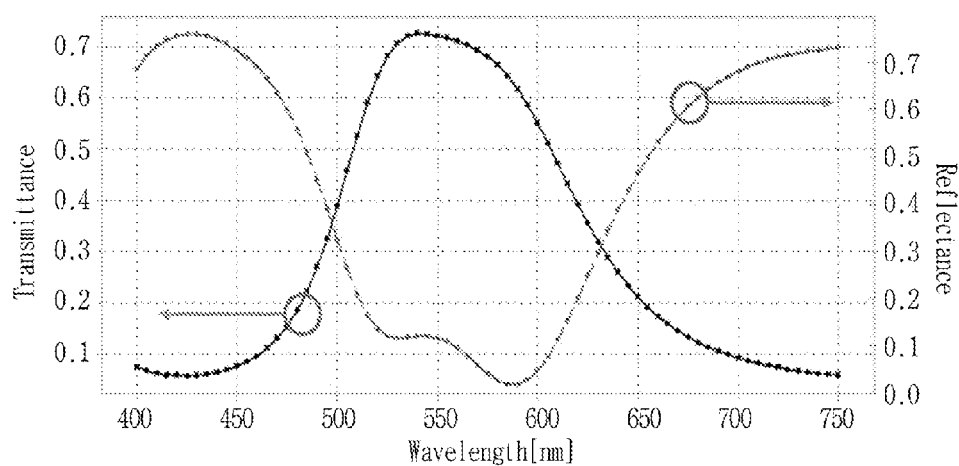
FIG. 4 is a graph illustrating an optical transmittance and a light reflectance of a capping layer.

To wrap up, the light generated by operation of the light emitting part is not radiated to the pixel part by the capping layer. Thus, the pixel part is also operated when the light emitting part is operated to solve the expected problems. Furthermore, light extraction efficiency can be also enhanced by the capping layer. The capping layer may include a dielectric mirror formed by a stacked structure in which dielectrics of different refractive indexes are stacked. In a case dielectrics of different refractive indexes are stacked, a mirror function is added to a stacked surface due to different refractive indexes. An optical transmittance and a light reflectance per wavelength of the capping layer are illustrated in FIG. 4, where a black line illustrates a transmittance and a red line indicates a reflectance. Referring to FIG. 4, the transmittance and the reflectance are respectively exhibited in a different size per wavelength, whereby optimum transmittance and reflectance can be harvested using the difference.

In a case an intensity of light of the first wavelength is $\lambda_1$, an intensity of light of the second wavelength is $\lambda_2$, a transmittance of the capping layer to the second wavelength is T, an intensity of light of the first wavelength radiated to the side of the second electrode from the light emitting part is 't', and an intensity of light of the first wavelength radiated to the side of the first electrode from the light emitting part is 'b', a total intensity of light radiated to the side of the first electrode may be defined by a sum of $\lambda_1 \times b/(b+t)$ and $\lambda_2 \times T$. For information, an intensity of light of the first wavelength radiated to a second light emitting part may be defined by $\lambda_1 \times t/(b+t)$.

The capping layer has a high transmittance to the light of the second wavelength, and has a high reflectance to the light of first wavelength to make the sum of $\lambda_1 \times b/(b+t)$ and $\lambda_2 \times T$ maximum, whereby the light extraction efficiency can be improved and as a result, power is less consumed to provide a desired quantity of light.

Although the foregoing has explained an ideal situation to explain the function of the capping layer (250), it is difficult to find a material having a 100% of reflectance relative to the first wavelength and a 100% of transmittance relative to the second wavelength.

Experimentally, it was verified that the light efficiency is improved if the capping layer has a 40% or more reflectance to the first wavelength and a 60% or more transmittance relative to the second wavelength. Thus, the capping layer (250) is capable enough if it has a 40% or more reflectance to the first wavelength and a 60% or more transmittance relative to the second wavelength. However, there is needed a countermeasure to cope with a part of the light radiated from the light emitting part functioning as a driving light source of pixel part by passing the capping layer.

In some exemplary embodiments, one of the countermeasures is to adjust size of each pixel at the pixel part and the light emitting part. In a non-limiting example, if each size of pixels at the pixel part is made smaller than that of the light emitting part, pixels of the pixel part that is simultaneously operated when the light emitting part is operated may reduce a bad influence of blurring the pixels of the light emitting part. As a result, definition (visibility factor) and the legibility can be improved. At the same time, light radiated from the pixel part is combined with the light radiated from the light emitting part to be outputted to the outside, whereby a desired intensity of light can be obtained with a smaller power. In this case, if viewed from a different point of view, a part of light radiated from the light emitting part is used by the reflective light used by the pixel part.

Furthermore, the light radiated from the light emitting part can be more positively used as reflective light. In a non-limiting example, a case of arranging the aforementioned capping layer at the light emitting part may be considered.

If a stacked structure is formed in the order of capping layer-light emitting part-pixel part, most of the light generated by the light emitting part can be radiated to the pixel part by the capping layer. Based on this case, the light radiated from the light emitting part functions as reflective light sufficient enough to drive the pixel part. Realistically, light of the light emitting part passing the capping layer exists, such that the light radiated from the light emitting part may be utilized for improving the color reproduction range.

Meanwhile, in a case only the pixel part is operated due to inoperable light emitting part, there is a problem of the color reproduction range being low.

As a measure to solve the abovementioned problem, a color filter part (290) is arranged between the light emitting part and the pixel part to improve the color reproduction range of light from the second wavelength. The color filter part (290) is an optical part expressing colors by extracting red-green-blue three colors. Thus, in a case a color filter part (290) adequate to the pixel part is arranged between the light emitting part and the pixel part, the color reproduction range of light from the second wavelength radiated from the pixel part can be improved. At this time, the color filter part (290) may be arranged at the light emitting part. The light radiated from the color filter part passes the light emitting part, such that there is no problem of the color filter part being arranged at the light emitting part.

Alternatively, the color reproduction range may be improved by auxiliarily operating the light emitting part. To be more specific, in an environment of sunlight where the light emitting part is not needed to be operated, the color reproduction range can be improved by auxiliarily operating the light emitting part, such that light of lesser intensity than that of the light radiated from the pixel part can be radiated.

In some exemplary embodiments, the display device of FIG. 3 may include a controller (280) to operate the light emitting part (230) and the pixel part (270) in response to an optical sensor (260) measuring intensity of the outside light and intensity of light measured by the optical sensor (260), because it is difficult for a user to directly control the auxiliary operation of the light emitting part. The optical sensor and the controller detects the intensity of outside light to auxiliarily operate the light emitting part, whereby color reproduction range of the color filter part can be enhanced.

Meanwhile, the aforementioned optical sensor and the controller are used to operate the light emitting part and the pixel part at an optimum condition. In a non-limiting example, the controller may operate the light emitting part when the intensity of outside light is less than a reference value. If the intensity of outside light is greater than the reference value, the controller may not operate the light emitting part but operate the pixel part only. Alternatively, the reference value is segmented (subdivided) and the light emitting part and the pixel part may be operated accordingly based on a section between each reference value.

Hereinafter, the control of the light emitting part and the pixel part using the optical sensor and the controller will be described in detail.

The optical sensor (260) may be the aforementioned optical sensor (56), and measures the intensity of the outside light such as sunlight. The controller (280) is used to operate the light emitting part (230) and the pixel part (270) in response to the intensity of outside light thus measured. The controller (280) may be the aforementioned processor (16), and operates the light emitting part (230) at a first section where the intensity of light measured by the optical sensor (260) is less than a first reference value. Furthermore, the controller (280) operates the pixel part (270) at a second section where the intensity of light measured by the optical sensor (260) is greater than a second reference value. Still furthermore, the controller (280) operates both the light emitting part (230) and the pixel part (270) at a third section where the intensity of light measured by the optical sensor (260) is in between the first reference value and the second reference value.

The first reference value is an intensity of light selected under a condition where an outside light source is weak like at night where illumination is weak. The second reference value is an intensity of light selected under a condition where an outside light source is strong like daytimes where illumination is strong. Therefore, the intensity of light indicated by the first reference value is smaller than that of the light indicated by the second reference value.

The light emitting part and the pixel part can be adequately operated in response to the intensity of outside light according to the optical sensor and the controller thus described.

Meanwhile, the controller controls in such a manner that a driving power of the light emitting part at the third section is smaller than that of the light emitting part at the first section. Because the pixel part and the light emitting part are simultaneously operated at the third section, light radiated from the pixel part is radiated to the outside additionally. Therefore, even if the light emitting part is operated at a weak level, the desired intensity of light can be obtained.

The controller (280) adjusts the intensity of light at the first wavelength in response to the intensity of light measured by the optical sensor (260) to improve the color reproduction range. The operating power of the light emitting part can be reduced because the intensity of light generated by the light emitting part can be additionally supplemented by the intensity of light generated by the pixel part.

A light emitting part and pixel part of flexible property can be configured according to the display device of FIG. 3, whereby a display device of such type as that of e-paper can be provided.

The previous description of the present invention is provided to enable any person skilled in the art to make or use the invention. Various modifications to the invention will be readily apparent to those skilled in the art, and the generic principles defined herein may be applied to other variations without departing from the spirit or scope of the invention. Thus, the invention is not intended to limit the examples described herein, but is to be accorded the widest scope consistent with the principles and novel features disclosed herein.

As apparent from the foregoing, the display device according to the present disclosure has an industrial applicability in that a self-emissive light emitting part and a reflectively-emissive pixel part are included together to improve legibility, color reproduction range and power consumption, a capping layer is added that transmits light of the pixel part and reflects light of the light emitting part to improve light extraction efficiency, whereby the power consumption can be reduced, and a color filter is added to further improve the color reproduction range of the pixel part.

What is claimed is:

1. A display device, the device comprising: a light emitting part including a first electrode, an organic light emitting layer and a second electrode for radiating light of a first wavelength; and a pixel part stacked on the light emitting part to radiate light of a second wavelength using a reflective light.

2. The display device of claim 1, further comprising a capping layer arranged between the light emitting part and the pixel part to reflect the light of the first wavelength and to transmit the light of the second wavelength.

3. The display device of claim 2, wherein the capping layer is stacked on the second electrode.

4. The display device of claim 2, wherein the capping layer reflects 40% or more of light of the first wavelength, and transmits 60% or more of light of second wavelength.

5. The display device of claim 1, further comprising a color filter part interposed between the light emitting part and the pixel part to enhance a color reproduction range of the light of the second wavelength.

6. The display device of claim 1, further comprising a color filter part arranged at the light emitting part to enhance a color reproduction range of the light of the second wavelength.

7. The display device of claim 1, wherein a pixel size of the pixel part is smaller than that of the light emitting part.

8. The display device of claim 1, wherein the reflective light is light radiated from the light emitting part.

9. The display device of claim 8, further comprising a capping layer arranged at the light emitting part to reflect the light of the first wavelength and to transmit the light of the second wavelength.

10. The display device of claim 1, further comprising: an optical sensor measuring intensity of external light; and a controller driving the light emitting part and the pixel part in response to the intensity of light measured by the optical sensor.

11. The display device of claim 10, wherein the controller drives the light emitting part in a case the intensity of the external light is less than a predetermined value.

12. The display device of claim 10, wherein the controller drives the light emitting part in a case the measured intensity of light is less than a first reference value, drives the pixel part in a case the measured intensity of light is more than a second reference value, and drives the light emitting part and the pixel part in a case the measured intensity of light is in between the first and second reference values.

13. The display device of claim 12, wherein the controller controls in such a manner that, the driving power of the light emitting part when the measured intensity of light is in between the first reference and second reference values is smaller than that of the light emitting part when the measured intensity of light is less than the first reference value.

14. The display device of claim 10, wherein the controller adjusts the intensity of light of the first wavelength in response to the measured intensity of light to enhance color reproduction range of the pixel part.

* * * * *